(12) United States Patent
Schimper

(10) Patent No.: US 8,860,512 B2
(45) Date of Patent: Oct. 14, 2014

(54) RING OSCILLATOR, MOBILE COMMUNICATIONS DEVICE, AND METHOD

(71) Applicant: Intel Mobile Communications GmbH, Neubiberg (DE)

(72) Inventor: Markus Schimper, Moosinning (DE)

(73) Assignee: Intel Mobile Communications GmbH, Neubiberg (DE)

( * ) Notice: Subject to any disclaimer, the term of this patent is extended or adjusted under 35 U.S.C. 154(b) by 96 days.

(21) Appl. No.: 13/630,586

(22) Filed: Sep. 28, 2012

(65) Prior Publication Data

US 2014/0091866 A1    Apr. 3, 2014

(51) Int. Cl.
*H03K 3/03*    (2006.01)

(52) U.S. Cl.
USPC ............................................. 331/57; 327/158

(58) Field of Classification Search
USPC ............................................. 331/57; 327/158
See application file for complete search history.

(56) References Cited

U.S. PATENT DOCUMENTS

2011/0109356 A1*    5/2011    Ali et al. ..................... 327/158

* cited by examiner

*Primary Examiner* — Joseph Chang
(74) *Attorney, Agent, or Firm* — Eschweiler & Associates, LLC

(57) ABSTRACT

A ring oscillator includes a ring of a plurality of delay elements and a start edge injector for injecting a start edge into the ring. The start edge injector varies an injection point for the start edge in the ring.

35 Claims, 11 Drawing Sheets

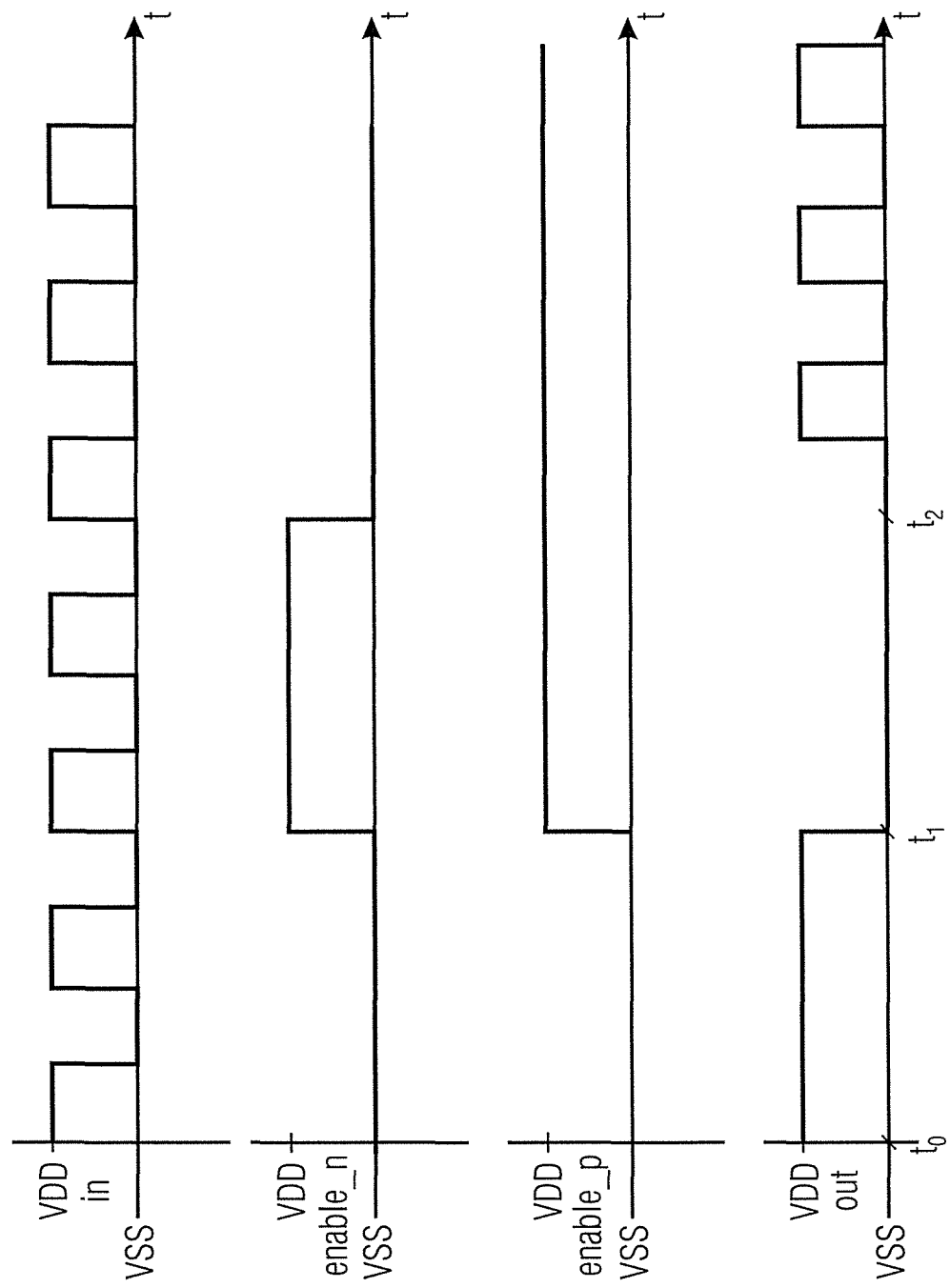

US 8,860,512 B2

RING OSCILLATOR, MOBILE COMMUNICATIONS DEVICE, AND METHOD

BACKGROUND

In time to digital converters it is desired to have a good integral nonlinearity (INL). Gated multipath ring oscillators (GRO) exist which perform a first order shaping. This first order shaping is achieved by storing the error on the gate capacitance. The working principle of these gated ring oscillators and the shaping are shown in FIG. 9. Even though these techniques improve the integral nonlinearity of a digital to time converter, the gated ring oscillator technique is not suitable for deep sub-micron CMOS technologies (e.g., 28 nm, 14 nm) due to gate leakage.

In digital PLL applications, the average measuring time may be 1 ns in comparison to a clock period of 32 ns (26 MHz). Thus, the gated ring oscillator technique is not applicable in digital PLLs in deep sub-micron CMOS technologies for a TDC integral nonlinearity improvement. In digital PLLs today, the induced spurs and phase noise performance degradation due to an integral nonlinearity of a time to digital converter is tolerated and is compensated with a narrow bandwidth in PLL loop filters.

Hence, it is desired to provide a concept which enables an improvement of the integral nonlinearity of a time to digital converter or in general of ring oscillators.

SUMMARY

According to one example, a ring oscillator comprising a ring having a plurality of delay elements and a start edge injector for injecting a start edge into the ring is disclosed. The start edge injector is configured to vary an injection point for the start edge in the ring.

According to another example, a mobile communication device comprising an antenna port, an RF frontend and a digital baseband processor is disclosed. The RF frontend or the digital baseband processor comprise the ring oscillator as described above. Furthermore, the RF frontend is coupled to the digital baseband processor and the antenna port.

BRIEF DESCRIPTION OF THE DRAWINGS

FIG. 3b shows an exemplary signal diagram for the delay element shown of FIG. 3a;

DETAILED DESCRIPTION

Figure 1:
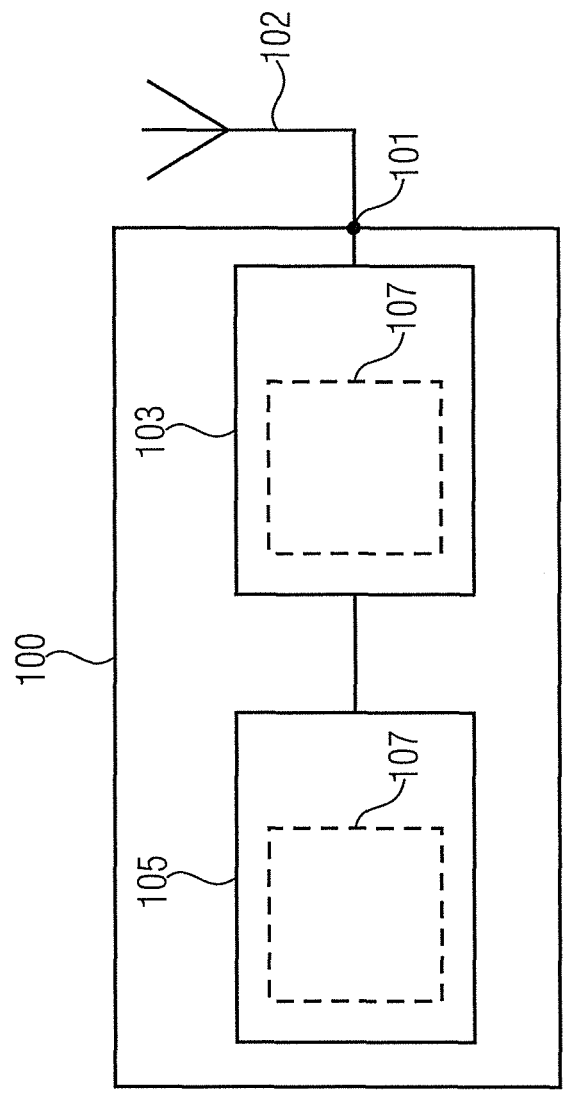
FIG. 1 shows a block diagram of an exemplary mobile communication device.

FIG. 1 shows a block diagram of an exemplary mobile communication device 100. The mobile communication device 100 comprises an antenna port 101 (e.g. for connecting to an antenna 102), an RF frontend 103 and a digital baseband processor 105. Furthermore, the mobile communication device 100 comprises a ring oscillator 107. The ring oscillator 107 comprises a ring having a plurality of delay elements and a start edge injector for injecting a start edge into the ring. The start edge injector is configured to vary an injection point for the start edge in the ring.

The RF frontend 103 is coupled to the digital baseband processor 105 and the antenna port 101. The ring oscillator 107 may be comprised within the digital baseband processor 105 or in the RF frontend 103 in various examples. Furthermore, the mobile communication device 100 may comprise a first ring oscillator 107 which is comprised within the digital baseband processor 105 and at least a second ring oscillator 107 which is comprised in the RF frontend 103.

As will also be described in the following, the exemplary ring oscillator 107 has an improved integral nonlinearity when compared to conventional ring oscillators. Hence, the ring oscillator 107 improves the overall performance of the mobile communication device 100 as it has an improved integral nonlinearity and therefore introduces less spurs and has a reduced phase noise performance when compared to conventional ring oscillators. Therefore, less effort has to be spent to compensate for phase noise and spurs introduced by the ring oscillator 107 into the mobile communication device 100. Hence, a mobile communication device 100 having the disclosed ring oscillator 107 shows a better performance when compared to conventional mobile communication devices and is may be easier to design and manufacture as less effort is to be spent in the compensation of spurs and phase noise.

In some cases, the mobile communication device 100 may be a portable communication device.

For example, the mobile communication device 100 may be configured to perform a voice and/or data communication (according to a mobile communication standard with another (portable) mobile communication device and/or a mobile communication base station). Such a mobile communication device may be, for example, a mobile handset such as a mobile phone (cell phone), a smart phone, a tablet PC, a broadband modem, a notebook or a laptop as well as router or a PC. Furthermore, such a mobile communication device may be a mobile communication base station.

Although, FIG. 1 illustrates the ring oscillator 107 as part of the mobile communication device 100, ring oscillator 107 is not limited to such applications and may also be used in other circuits or devices. In the following, different examples of such a ring oscillator 107 will be described in more detail.

Figure 2:
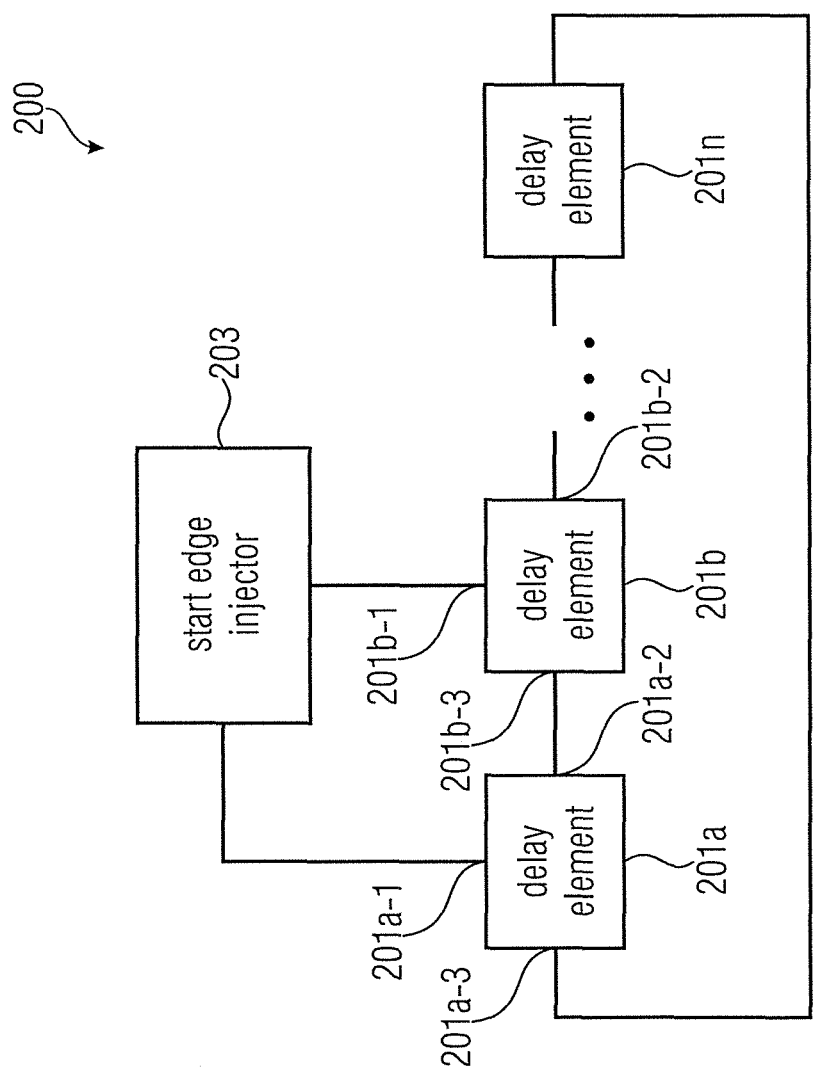
FIG. 2 shows an exemplary ring oscillator.

FIG. 2 shows a block diagram of an exemplary ring oscillator 200. The exemplary ring oscillator 200 may be an implementation of the ring oscillator 107 shown in conjunction with the mobile communication device 100.

The ring oscillator 200 comprises a ring having a plurality of delay elements 201a to 201n. Furthermore, the ring oscillator 200 comprises a start edge injector 203. The start edge injector 203 is configured to inject a start edge (for an oscillation of the ring oscillator 200) into the ring. Furthermore, the start edge injector 203 is configured to vary an injection point for the start edge in the ring.

It has been found that by varying a start edge injection point of a ring oscillator the integral nonlinearity performance of the ring oscillator may be significantly improved when compared to systems in which for each oscillation cycle of the ring oscillator uses a same injection point. The improvement of the integral nonlinearity of the ring oscillator 200 leads to fewer and/or lower spurs and to less phase noise and therefore to an overall improved performance of the ring oscillator 200.

For example, ring oscillator 200 may be used in a time to digital converter, for example to measure a time between two edges (of the same signal or of different signals). The use of the ring oscillator 200 in a time to digital converter improves the integral nonlinearity of the time to digital converter and therefore an overall performance of such a time to digital converter.

From FIG. 2 it may be seen that the start edge injector 203 is configured to inject the start edge into a delay element 201a to 201n of the ring oscillator 200. The start edge injector 203 varies the start edge by varying the delay element 201a to 201n into which the start edge injector 203 injects the start edge for a current oscillation cycle.

Furthermore, the ring oscillator 200 may comprise the following additional features.

From FIG. 2 it may be seen that at least two delay elements in the ring comprise a start edge injection input 201-1, 201b-1 for injecting the start edge into the ring at the respective delay element 201a, 201b. Hence, for a given oscillation cycle to be started, the start edge injector 203 is configured to insert the start edge into the start edge injection input 201a-1 of a first delay element 201a or into the start edge injection input 201b-1 of a second delay element 201. In the example shown in FIG. 2 the two delay elements 201a, 201b having start edge injection inputs 201a-1, 201b-1 are directly succeeding one another. In further exemplary implementations of the ring oscillator 200 further delay elements of the ring could be placed between the first delay element 201a having start edge injection input 201a-1 and the second delay element 201b having start edge injection input 201b-1.

Furthermore, in some examples, respective delay element 201a to 201n may comprise a start edge injection input. In such examples, the start edge injector 203 may choose the start edge injection input from the plurality of start edge injection inputs of the plurality of delay elements.

For example, and as will also be described using FIGS. 3a to 5, the start edge injector 203 may be configured to inject the start edge in the ring by releasing an output 201a-2, 201b-2 of a delay element 201a, 201b which was forced to a predetermined potential. For example, the start edge injector 203 is configured to apply a certain potential or signal to a start edge injection input 201a-1, 201b-1 which forces the output 201a-2, 201b-2 of the corresponding delay element 201a, 201b to a predetermined potential (independent of a potential at an input 201a-3, 201b-3 of the delay element 201a, 201b). Forcing the output of the delay element 201a, 201b to the predetermined potential leads to a stopped state of the ring oscillator 200 (i.e. the ring oscillator 200 is not oscillating). If the start edge injector 203 releases the output 201a-2, 201b-2 of the delay element 201a, 201b the start edge is injected into the ring and the inserted start edge is propagated as a ring oscillator edge from one delay element 201a to 201n to the next delay element in the ring 201a to 201n until the oscillation cycle is stopped.

As described above, the start edge injector 203 varies the injection point of the start edge in the ring by varying the delay element 201a, 201b of the plurality of delay elements 201a to 201n, the output 201a-2, 201b-2 of which is forced to the predetermined potential and is released for inserting the start edge. For example, for starting a first oscillation cycle, the start edge injector 203 inserts the start edge into the start edge injection input 201a-1 of the first delay element 201a. Subsequently, after finishing this first oscillation cycle, the start edge injector 203 inserts, for starting a second oscillation cycle, the start edge into the start edge injection input 201b-1 of the second delay element 201b. As will be shown in the following, the start edge injector 203 may be configured to choose the injection point for inserting the start edge for the next oscillation cycle in dependence on the result of the last oscillation cycle (e.g. according to a so called barrel shifting principle).

Furthermore, the start edge injector 203 may also be configured to randomly determine the injection point for the start edge for the next oscillation cycle. It has been appreciated by the inventors that it is advantageous for the integral nonlinearity of the ring oscillator 200 if the start edge injector 203 determines the injection point for starting the next oscillation cycle randomly when compared to systems in which the injection point for injecting the start edge into the ring is the same.

For example, the delay elements 201a to 201n may be implemented using one or more inverters. Hence, the delay elements 201a to 201n may be configured to provide an output signal at its output 201a-2, 201b-2 based on an inversion of an input signal received at its input 201a-3, 201b-3.

Figure 3A:
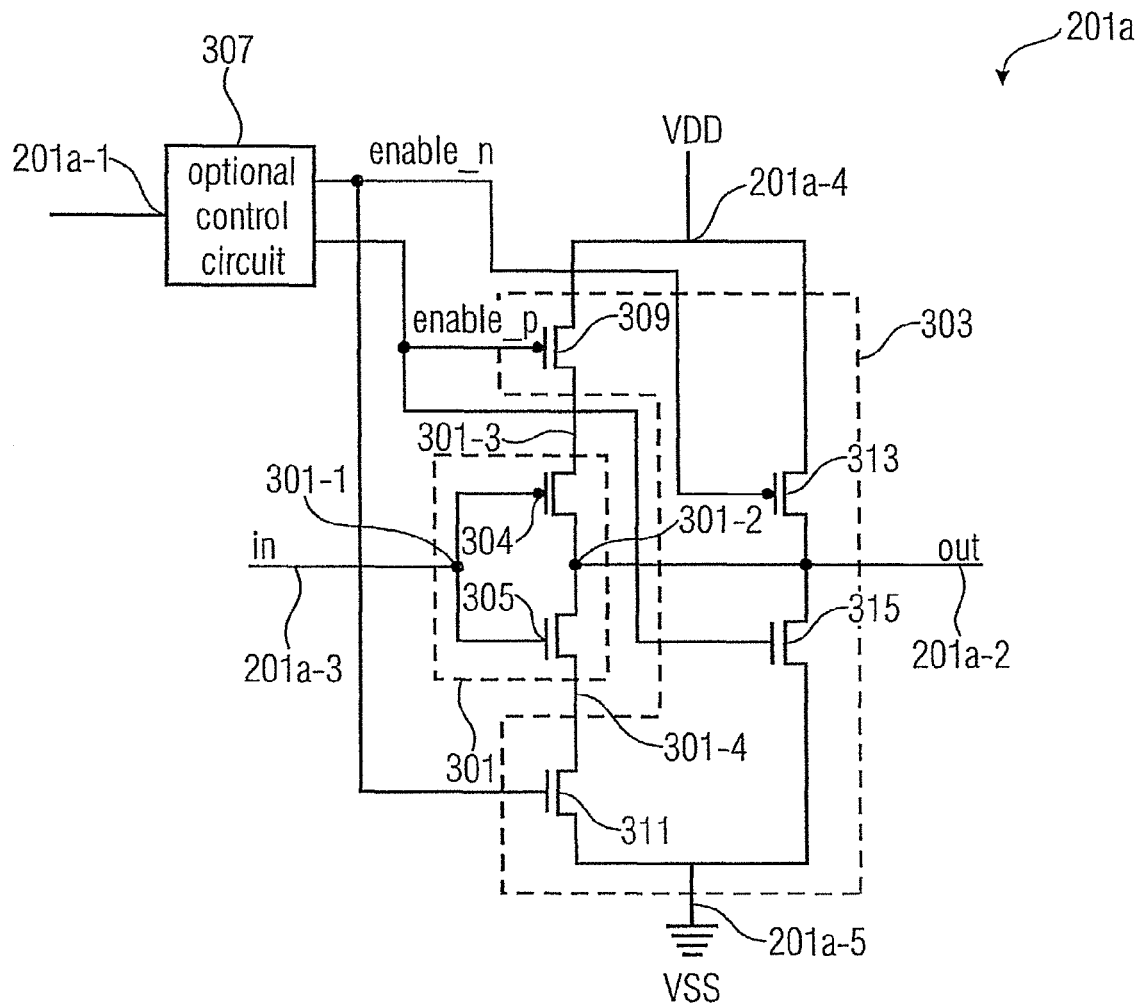
FIG. 3a shows an exemplary implementation of a delay element of the ring oscillator of FIG. 2.

FIG. 3a is a schematic diagram showing an exemplary implementation of the delay element 201a of FIG. 2. Even though the schematic in FIG. 3a shows an exemplary schematic for the delay element 201a, further delay elements of the ring oscillator 200 (having a start edge injection input) may also have the same schematic as described in FIG. 3a.

The delay element 201a comprises an inverter 301 and a start edge multiplexer 303. The inverter 301 comprises a data input 301-1 and a data output 301-2. The data input 301-1 of the inverter 301 is connected to the input 201a-3 of the delay element 201a and the data output 301-2 of the inverter 301 is connected to the output 201a-2. Hence, the inverter 301 is configured to (at least in an activated state of the inverter 301) provide an output signal at its data output 301-2 by performing an inversion of the signal received at the data input 301-1.

The inverter 301 further comprises a first supply terminal 301-3 and a second supply terminal 301-4. Furthermore, the inverter 301 comprises a first transistor 304 of a first transistor type (e.g. PMOS type) and a second transistor 305 of a second transistor type (e.g. NMOS transistor). A switchable path of the first transistor 304 is connected between the first supply terminal 301-3 of the inverter 301 and the data output 301-2 of the inverter 301. A switchable path of the second transistor 305 is connected between the data output 301-2 and the second supply terminal 301-4 of the inverter 301. Control terminals (e.g. gates) of the transistor 304, 305 are connected to the data input 301-1 of the inverter 301.

The start edge multiplexer 303 is connected between a first supply terminal 201a-4 of the delay element 201a and a second supply terminal 201a-5 of the delay element 201a. The start edge multiplexer 303 is configured to activate and deactivate a function of the inverter 301 and furthermore to selectively force the output 201a-2 to a first predetermined potential (e.g. VDD-supply potential) and to a second predetermined potential (e.g. VSS-ground potential). The start edge multiplexer 303 is further coupled to the start edge injection input 201a-1 of the delay element 201a. As shown in FIG. 3a, the start edge multiplexer 303 may further comprise an optional control circuit 307 which is coupled to the start edge injection input 201a-1 of the delay element 201a. Alternatively, in other exemplary implementations of the delay element 201a the optional control circuit 307 could be omitted and control signals (such as enable_n and enable_p) for the start edge multiplexer 303 may be provided directly by the start edge injector 203.

The start edge multiplexer 303 comprises a third transistor 309 of the first transistor type, a fourth transistor 311 of the second transistor type, a fifth transistor 313 of the first transistor type and a sixth transistor 315 of the second transistor type.

A switchable path of the third transistor 309 is connected between the first supply terminal 201a-4 of the delay element 201a and the first supply terminal 301-3 of the inverter 301. A switchable path of the fourth transistor 311 is connected between the second supply terminal 301-4 of the inverter 301 and the second supply terminal 201a-5 of the delay element 201a. Control terminals of the third transistor 309 and the fourth transistor 311 are connected to the optional control circuit 307. The start edge multiplexer 303 is configured to activate and deactivate a functionality of the inverter 301 by means of the transistors 309, 311. As an example, in a conductive state of the switchable paths of the transistor 309, 311 the inverter 301 is fully active, while in a non-conductive state of at least one of the switchable paths of the transistors 309, 311 the inverter 301 is at least partly not working or partly deactivated. Hence, the start edge multiplexer 303 is configured to, in dependence on a signal received at the start edge injection input 201a-1, activate and deactivate the inverter 301.

Furthermore, a switchable path of the fifth transistor 313 is connected between the first supply terminal 201a-4 of the delay element 201a and the output 201a-2 of the delay element 201a and a switchable path of the sixth transistor 315 is connected between the output 201a-2 of the delay element 201a and the second supply terminal 201a-5 of the delay element 201a. The start edge multiplexer 303 is configured to force the output 201a-2 to a first potential or a second potential using the transistors 313, 315. For example, to force the output 201a-2 to the supply potential VDD the start edge multiplexer 303 brings the switchable path of the fifth transistor 313 into the conductive state. To force the output 201a-2 of the delay element 201a to the ground potential VSS, the start edge multiplexer 303 brings the switchable path of the sixth transistor 315 into the conductive state.

Hence, the control terminals of the transistors 313, 315 are coupled to the start edge injection input 201a-1 (by means of the control circuit 307).

As may be seen from FIG. 3a, the control terminal of the fourth transistor 311 is connected to the control terminal of the fifth transistor 313, which both receive the same control signal enable_n from the optional control circuit 307. Furthermore, the control terminals of the third transistor 309 and the sixth transistor 315 are connected to each other to receive the control signal enable_p from the optional control circuit 307. As already pointed out, the optional control circuit 307 may also be omitted and the start edge injector 203 could directly provide (at the start edge injection input 201a-1 of the delay element 201a) both the control signal enable_n and the control signal enable_p. The functionality of the delay element 201a shown in FIG. 3a is described in more detail using the exemplary signal diagrams shown in FIG. 3b.

In the first diagram of FIG. 3b the input signal, in, provided at the input 201a-3 of the delay element 201a is shown. In the second diagram the control signal enable_n is shown, which is provided to the control terminal of the fourth transistor 311 and the control terminal of the fifth transistor 313. In the third diagram of FIG. 3b the control signal enable_p is shown, which is provided to the control terminal of the third transistor 309 and the control terminal of the sixth transistor 315.

Furthermore, in the fourth diagram of FIG. 3b the resulting output signal, out, provided at the output 201a-2 of the delay element 201a is shown.

In the diagrams shown in FIG. 3b it is assumed that the signals are toggled between the two potentials VSS (e.g. logical zero) and VDD (e.g. logical one).

For $t_0 < t < t_1$ the output of the delay element 201a-2 is forced to the predetermined potential VDD (e.g. logical one) by setting the control signals enable_n, enable_p to the potential VSS. It may be seen that the output 201a-2 of the delay element 201a is forced to this predetermined potential VDD independent of the signal, in, at the input 201-3 of the delay element 201a.

For $t_1 < t < t_2$ the output 201a-2 of the delay element 201a is forced to the predetermined potential VSS (logical zero) by setting the control signals enable_n and enable_p to VDD. The output signal, out, at the output 201a-2 of the delay element 201a is still independent of the input signal, in, at the input 201a-3 of the delay element 201a.

For $t > t_2$ the inverter 301 is activated and the delay element 201a is released by setting the control signal enable_n to VSS and the control signal enable_p to VDD. Hence, the delay element 201a provides the output signal, out, at its output 201a-2 based on an inversion of its input signal, in, received at its input 201a-3.

From FIG. 3b it may be seen that the delay element 201a is released when its output 201a-2 is not forced to a predetermined potential anymore and its functionality is equal to the functionality of a simple inverter. A unit delay of the delay element 201a then corresponds to the unit delay of the inverter 301.

Although the start edge multiplexer 303 of the delay element 201a is configured to force the output 201a-2 of the delay element 201a at a first point in time to the first predetermined potential and at a second point in time to the second predetermined potential (using the transistors 313, 315), in further exemplary implementations one of the transistors 313, 315 could be omitted if it is sufficient that the output 201a-2 may be forced to one predetermined potential (e.g. the first predetermined potential or the second predetermined potential).

Figure 4:
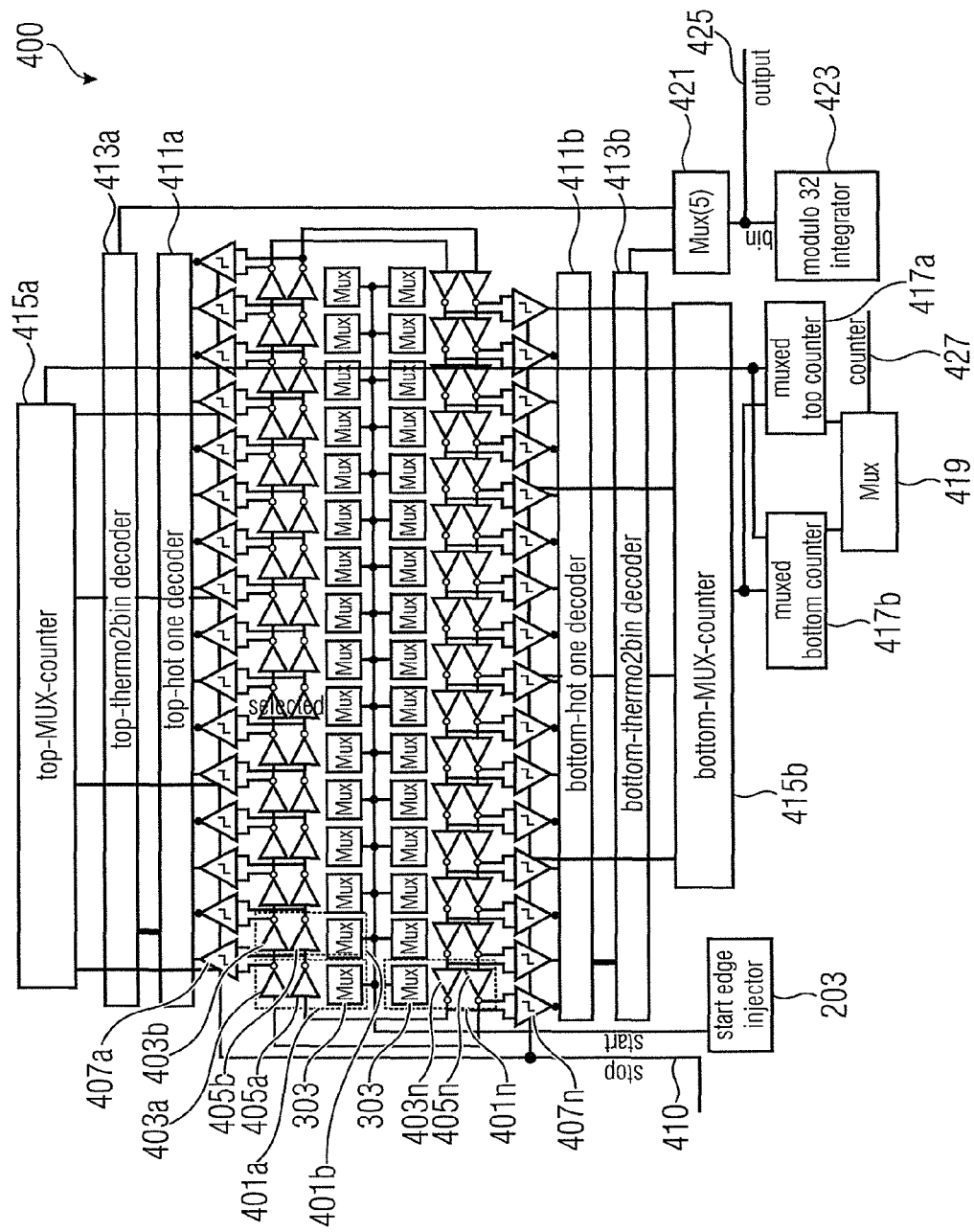
FIG. 4 shows an exemplary implementation of the ring oscillator of FIG. 2.

FIG. 4 shows an exemplary implementation of a ring oscillator 400 corresponding to the ring oscillator 200 shown in FIG. 2.

As may be seen from FIG. 4, the ring oscillator 400 is a differential ring oscillator comprising a plurality of delay stages 401a to 401n. Each delay stage 401a to 401n comprises a first delay element 403a to 403n and a second delay element 405a to 405n. The first delay elements 403a to 403n are connected in series to form a first delay chain (e.g. a positive delay chain) of the differential ring of the ring oscillator 400. The second delay elements 405a to 405n are connected in series to form a second delay chain (e.g. a negative delay chain) of the differential ring.

Furthermore, the ring oscillator 400 comprises a plurality of comparators 407a to 407n, inputs of which are connected to the outputs of the delay elements 403a to 403n, 405a to 405n. In detail, the ring oscillator 400 comprises per delay stage an associated comparator 407a to 407n, a first input of which is connected to an output of one of the delay elements of the associated delay stage 401a to 401n and a second input of which is connected to the other delay element of the associated delay stage 401a to 401n. From FIG. 4 it may be seen that every second comparator (or in other words comparators associated to an even delay stage) has an inverted output.

Alternatively, in another exemplary implementation of the ring oscillator 400, inputs of every second comparator may be complementarily connected to the outputs of the associated delay stage then the inputs of the comparators associated to the preceding delay stage. As an example, a first input of a first comparator would be connected to the output of the first delay element of the first delay stage and a second input of the first comparator would be connected to the output of the second delay element of the first delay stage. According to the principle mentioned above, for a comparator being associated to a delay stage directly succeeding the first delay stage, the first input of this comparator would be connected to the output of the second delay element of the preceding delay stage and the second input of the comparator would be connected to the output of the first delay element of the preceding delay stage.

This complementary circuiting of the inputs of the comparators or the outputs of the comparators being associated to directly succeeding delay stages enables that a hot one decoder may determine the position of the oscillator edge in the ring oscillator 400, as will be described in the following.

Furthermore, for each of the delay elements 403a to 403n, 405a to 405n a start edge multiplexer 303 is provided. Although in FIG. 4 the start edge multiplexers 303 are shown as external components of the delay elements 403a to 403n, 405a to 405n, these start edge multiplexers may also be integrated into the delay elements 403a to 403n, 405a to 405n as shown in conjunction with the delay element 201a shown in FIG. 3a.

The functionality of the differential ring of the ring oscillator 400 will be explained in the following using a more simple example shown in FIG. 5. The example shown in FIG. 5 comprises a differential ring comprising six differential delay stages 401a to 401f. Each differential delay stage 401a to 401f comprises a first delay element 403a to 403f and a second delay element 405a to 405f. The first delay elements 403a to 403f are connected in series to form a first delay chain of the differential ring and the second delay elements 405a to 405f are connected in series to form a second delay chain of the differential ring. Furthermore, the differential ring comprises per delay stage 401a to 401f an associated comparator 407a to 407f.

First input of comparators 407a, 407c, 407e being associated to odd delay stages 401a, 401c, 401e are connected to the outputs of the first delay element 403a, 403c, 403e of its associated delay stage 401a, 401c, 401e. Second inputs of the comparators 407a, 407c, 407e associated to the odd delay stages 401a, 401c, 401e are connected to the outputs of the second delay elements 405a, 405c, 405e of the associated delay stages 401a, 401c, 401e. In contrast to this, for comparators 407b, 407d, 407f being associated to even delay stages 401b, 401d, 401f, the first inputs of such comparators 407b, 407d, 407f are connected to the outputs of the second delay elements 405b, 405d, 405f of the associated delay stages 401b, 401d, 401f and the second inputs of such comparators 407b, 407d, 407f are connected to the outputs of the first delay elements 403b, 403d, 403f of the associated delay stages 401b, 401d, 401f.

Figure 5:
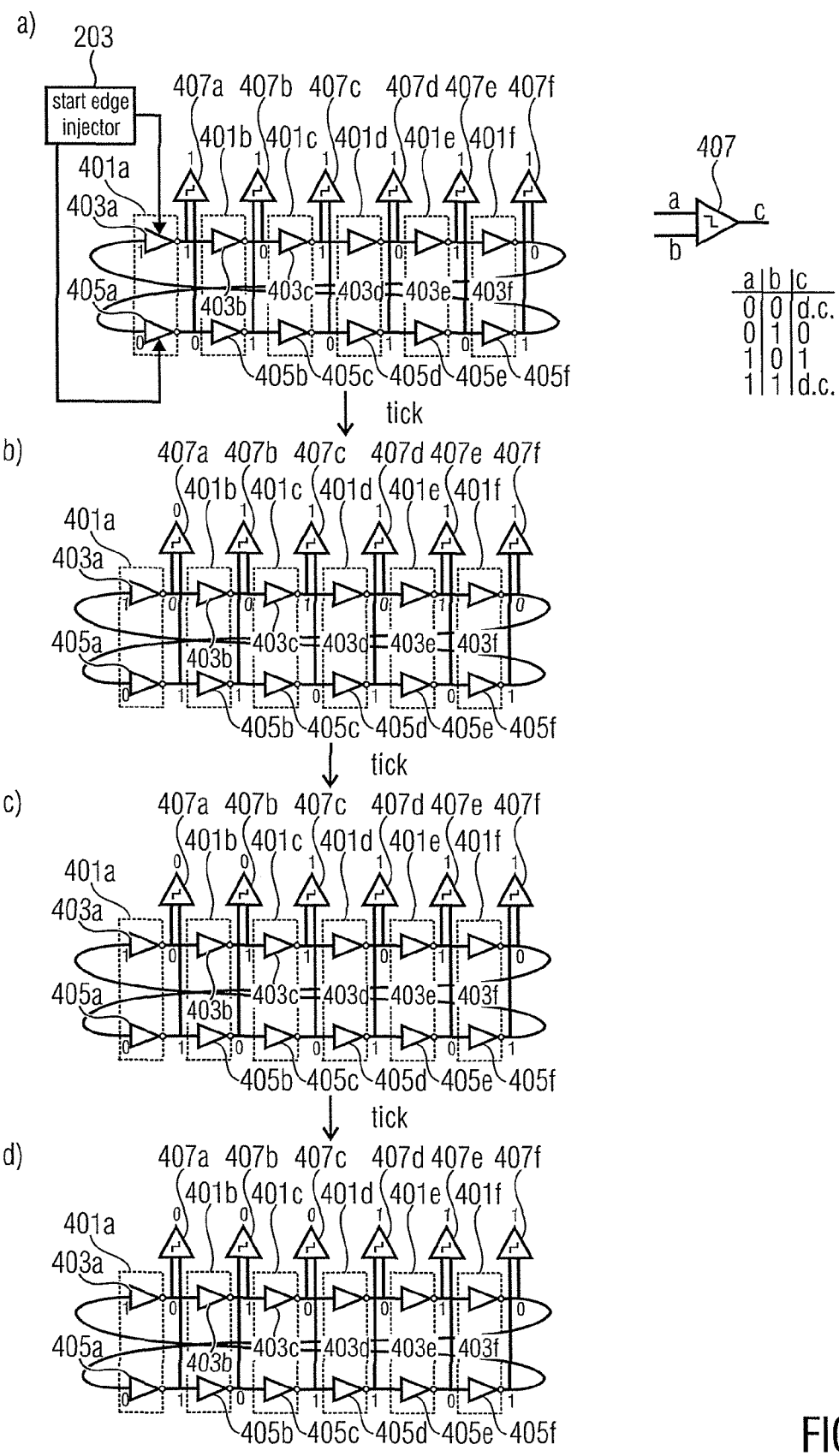
FIG. 5 shows a simplified example of how a ring oscillator edge is propagated from one delay element to a next delay element in the ring oscillator of FIG. 4.

FIG. 5 furthermore shows an example for a logic table for such a comparator 407. It may be seen that for a low level at its first input a and a high level at its second input b the comparator 407 generates at its output c a low level and for a high level at its first input a and a low level at its second input b the comparator 407 generates at is output c a high level. The conditions in which the potential at the first input a and the second input b are equal may be defined as don't care conditions, as such conditions should not occur in the differential ring as shown in FIG. 5, although it comprises an even number of delay stages.

Furthermore, an output of a last delay element 403f of the first delay chain is connected to an input of the first delay element 405a of the second delay chain and an output of the last delay element 405f of the second delay chain is connected to an input of the first delay element 403a of the first delay chain. In other words, for a pair of two subsequent delay stages (401f, 401a) in the ring, the output of the first delay element 403f of the first delay stage 401f of the pair is coupled to the input of the second delay element 405a of the second delay stage 401 of the pair (succeeding the first delay stage 401f of the pair) and an output of the second delay element 405f of the first delay stage 401f of the pair is coupled to the input of the first delay element 403a of the second delay stage 401a of the pair. By having this cross coupling of the first and second delay chain of the differential ring, the ring oscillator functionality of the differential ring oscillator shown in FIG. 5 may be ensured.

From FIG. 5a it may be seen how the starter injector 203 injects the start edge into the differential ring. The start edge injector 203 is configured to insert the start edge as a differential edge into the ring. This may be seen in FIG. 5a as the start edge injector 203 forces the output of the first delay element 403a of the first delay stage 401a to a first predetermined potential (e.g. logical high) and the output of the second delay element 405a of the first delay stage 401a to a second predetermined potential (e.g. logical low). Hence, the first predetermined potential and the second predetermined potential may be complementary to each other. In other words, the first predetermined potential corresponds to a first logical state and the second predetermined potential corresponds to a second logical state, which is complementary to the first logical state. The forcing of the outputs of the delay elements 403a, 405a leads to a propagation of the output signals of the delay elements 403a, 405a through the differential ring and to the condition that the input signal at the input of the first delay element 403a has the same predetermined potential (the first predetermined potential) as the output signal provided at the output of the first delay element 403a. Furthermore, also the input signal at the input of the second delay element 405a of the first delay stage 401a takes the same potential (the second predetermined potential) as the output signal at the output of the second delay element 405a.

Hence, the start edge injector 203 forces the outputs of the delay elements 403a, 405a to the first predetermined potential and the second predetermined potential at least as long as the potential at the input of the first delay element 403a is equal to the potential at the output of the first delay element 403a of the first delay stage 401a and the potential at the input of the second delay element 405a is equal to the potential at the output of the second delay element 405a of the first delay stage 401a.

In this state, the potentials of the outputs of the different delay elements 403a to 403f, 405a to 405f of the differential ring stay constant. In other words, the differential ring oscillator is not oscillating. The start edge injector 203 may now inject the start edge into the ring by (simultaneously) releasing the output of the first delay element 403a of the first delay stage 401a which was forced to the first predetermined potential and the output of the second delay element 405a of the first delay stage 401a which was forced to the second predetermined potential (the first and the second predetermined potential being different from each other). From the transition from FIG. 5a to FIG. 5b it may be seen how the start edge is now propagated as the ring oscillator edge in the differential ring oscillator. The ring oscillator edge may be seen at the outputs of the comparators 407a to 407f by (for an even circulation) a rising edge from a logical zero to one. Hence, after one unit delay (which is based on the unit delay of the inverters 301 of the delay elements 403a to 403f, 405a to 405f) the oscillator edge is propagated from the first delay stage 401a to the second delay stage 401b. This may also be seen by the fact that the potential at the input of the first delay element 403b of the second delay stage 401b equals the potential at the output of the first delay element 403b of the second delay stage 401b and the potential at the input of the second delay element 405b of the second delay stage 401b equals the potential at the output of the second delay element 405b of the second delay stage 401b.

To summarize, from FIG. 5 it may be seen that the start edge injector 203 is configured to, before an oscillation cycle is to be started, choose the injection point for inserting the start edge for the oscillation cycle by forcing the outputs of the chosen delay elements 403a, 403f into which the start edge for the oscillation cycle is to be inserted to the first predetermined potential and the second predetermined potential.

Furthermore, the start edge injector 203 is configured to force the output of the chosen delay elements 403a, 403f to the predetermined potentials at least until the inputs of the chosen delay elements 403a, 403f have the predetermined potentials to which the outputs are forced before the start edge injector 203 releases the outputs of the chosen delay elements 403a, 403f for inserting the start edge into the differential ring.

Furthermore, the start edge injector 203 is configured to, during forcing the outputs of the chosen delay elements 403a, 403f to the predetermined potentials, keep the outputs of the other delay elements 403b to 403f, 405b to 405f preceding or succeeding the chosen delay elements 403a, 403f in the ring in a released state. In such a released state of a delay element the output of the delay element is based on the input of the delay element. For example, in a released state of a delay element the delay element provides at its output an inversed version of the signal received at its input. Furthermore, FIG. 5 shows that the start edge is injected into the differential ring as a differential start edge which is then propagated from one delay stage 401a to 401f to the next delay stage 401a to 401f as a differential ring of oscillator edge.

Although the description of FIG. 5 was provided for a differential ring oscillator having an even number of delay stages (and delay elements), in a further exemplary implementation of the ring oscillator 200, a single ended ring could also be used (e.g. having an odd number of delay elements). In such a single ended ring, the start edge injector 203 forces the output of one delay element in the single ended ring to a predetermined potential at least until an input of this chosen delay element has the predetermined potential before the start edge injector releases the output of the chosen delay element for inserting the start edge into the ring. In such a single ended implementation of the ring oscillator 200 the comparators 407a to 407f may be omitted and the ring oscillator edge may be directly detected at the output of the delay elements in the single ended ring.

Furthermore, FIGS. 5b to 5d show two further unit delays as an example how the ring oscillator edge is propagated through the differential ring.

As already pointed out in conjunction with FIGS. 2 and 4, the start edge injector 203 is configured to vary the insertion point for injecting the start edge into the ring. Hence, for a next oscillation cycle after the oscillation cycle shown in FIG. 5 has stopped, the start edge injector 203 may choose another delay stage of the plurality of delay stages 401a to 401f to insert the start edge into the ring.

Figure 6:
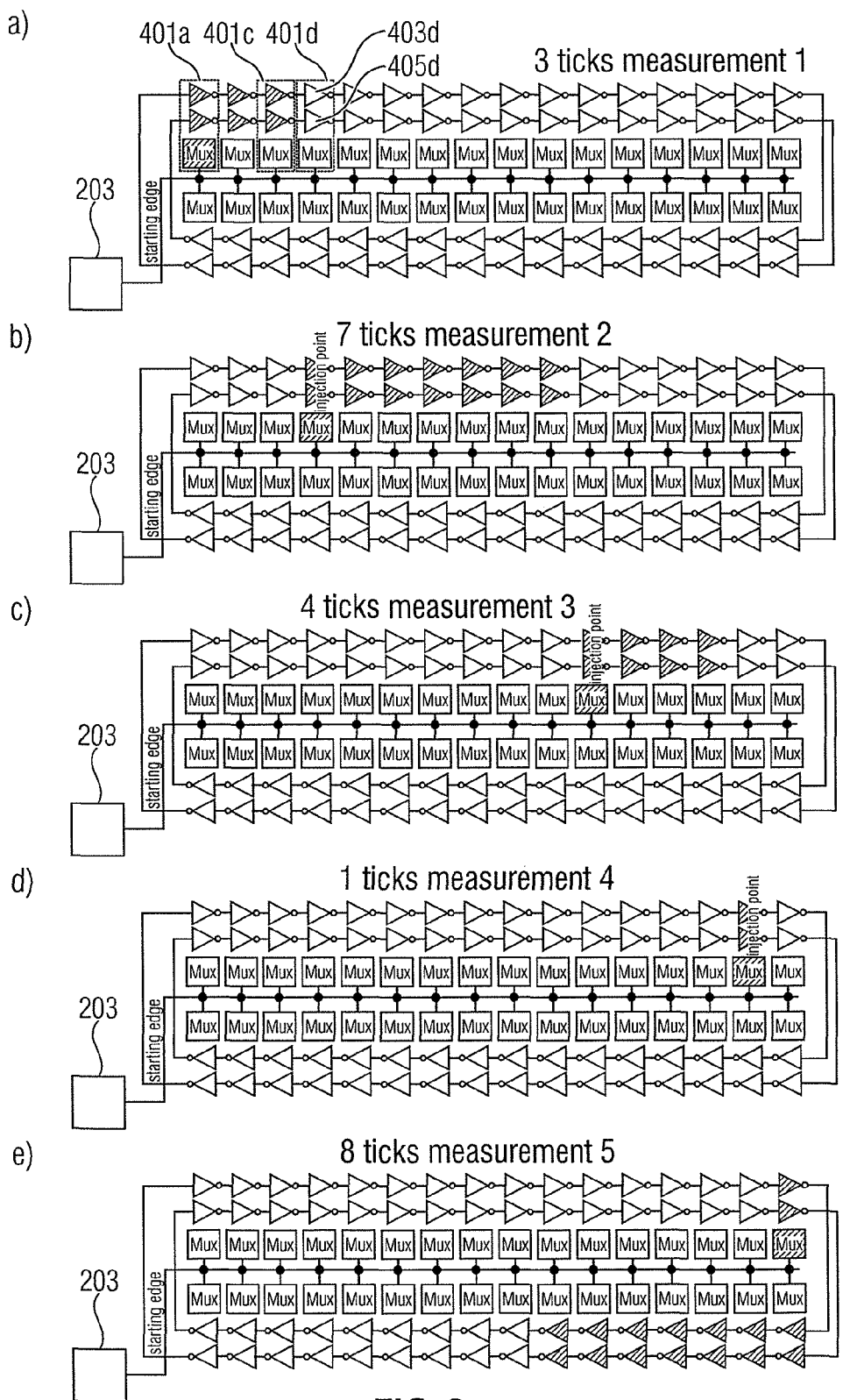
FIG. 6 shows an example how barrel shifting is applied to the ring oscillator of FIG. 4.

This is explained with a simple example shown in FIG. 6 in which the start edge injector injects the start edge for a next oscillation cycle in dependence on the last oscillation cycle.

In FIGS. 6a to 6e five different measurements using the differential ring of the ring oscillator 400 are shown. In these figures the delay elements which are used for performing the measuring are hatched. Furthermore, the start edge multiplexers of the delay elements into which the start edge is inserted for a respective measurement are hatched.

FIG. 6a shows a first measurement with a length of three ticks (three unit delays). It may be seen that the start edge injector 203 injects the start edge into the first delay stage 401a of the differential ring. The measurement is stopped (e.g. based on a received stop signal) after the ring oscillator edge has passed the third delay stage 401c. Hence, at the moment at which the measurement was stopped, the ring oscillator edge occurs at the fourth delay stage 401d, which may be seen in the fact that the potential at the input of the first delay element 403d of the fourth delay stage 401d equals the potential at the output of the first delay element 403d of the fourth delay stage 401d and furthermore the potential at the input of the second delay element 405d of the fourth delay stage 401d equals the potential at the output of the second delay element 405d of the fourth delay stage 401d.

The described barrel shifting principle may be seen between FIG. 6a and FIG. 6b. As shown in FIG. 6b a second measurement is started and the start edge is injected into the fourth delay stage 401d (at which the ring oscillator edge occurred when the last measurement was stopped). Hence, the start edge injector 203 is configured to insert the start edge for a next oscillation cycle or measurement cycle into the last delay element in the ring to which the oscillator edge was propagated before a stop oscillation signal or stop measurement signal was received (e.g. in response to which the ring oscillator 400 latched the outputs of the comparators 407a to 407n, as will be described in more detail in the following).

Furthermore, FIGS. 6c to 6e show the barrel shifting principle for a third, fourth and fifth measurement. From FIGS. 6c to 6e it may be seen that the start edge injector 203 chooses the delay stage into which the start edge injector 203 inserts the start edge for a next oscillation or measurement cycle to which the oscillator edge of the last oscillation cycle or measurement cycle was propagated before a stop signal has been received (e.g. before the outputs of the delay stages have been latched or stored). In other words, the ring oscillator is configured to, upon reception of a stop signal, latch a state of the ring oscillator. The start edge injector 203 is configured to insert the start edge for a next oscillation cycle into the last delay element in the ring to which the ring oscillator edge was propagated before the stop signal was received and the ring oscillator state was latched. Hence, from FIG. 6 it may be seen that the start edge injector 203 is configured to choose the injection point for inserting the start edge for a next oscillation cycle in dependence on the result of the last oscillation cycle.

The ring oscillator 400 may comprise per delay element an associated start edge multiplexer 303 for inserting the start edge into the ring at this delay element. The start edge injector 203 is configured to activate for inserting in a single ended ring, at maximum one start edge multiplexer of the plurality of start edge multiplexers for inserting the start edge into the ring at the associated delay element. In the differential case (as shown in FIG. 4) the start edge injector 203 activates at maximum a first start edge multiplexer associated to a first delay element of a delay stage into which the start edge is to be inserted and a second start edge multiplexer associated to a second delay element of the delay stage into which the start edge is to be inserted. Or in other words, in the differential case, the start edge injector 203 is configured to activate at maximum one pair of a plurality of pairs of start edge multiplexers, each pair being associated to a delay stage of the plurality of delay stages for inserting the start edge into this delay stage.

Hence, the ring oscillator 400 comprises at least a first pair of start edge multiplexers 303 for providing a first injection point at the first delay element 403a and the second delay 405a element of the first delay stage 401a of the plurality of delay stages for inserting the start edge into the ring at the first delay stage 401a. Furthermore, the ring oscillator 400 comprises a second pair of start edge multiplexers 303 for providing a second injection point at the first delay element 403b and the second delay element 405b of the second delay 401b stage of the plurality of delay stages for inserting the start edge into the ring at the second delay stage 401b. Furthermore, the start edge injector 203 is configured to activate for inserting the start edge into the ring at maximum one of the first pair of start edge multiplexers 303 and the second pair of start edge multiplexers 303.

The barrel shifting as described in FIG. 6 significantly improves in band spurs and phase performance when compared to conventional ring oscillators or time to digital converters. The barrel shifting in the ring oscillator 400 is realized by moving the start edge injection point around the ring of the ring oscillator 400 according to the barrel shifting scheme shown in FIG. 6. While in a digital to analog converter which uses barrel shifting for mismatch shaping the unit element is current, which sums up to the output of the digital to analog converter, in the ring oscillator 400 or in the time to digital converter 400, the unit element is a delay (of an inverter 301 of a delay element).

Now referring back to FIG. 4, the functionality of the ring oscillator 400 shall be explained in more detail.

As already described, the ring oscillator 400 is configured to, upon reception of a stop signal 410, latch a state of the ring oscillator 400. The state of the ring oscillator 400 is determined by the states of the outputs of the comparators 407a to 407n. Hence, the ring oscillator 400 is configured to, upon reception of the stop signal 410 latch the outputs of the comparators 407a to 407n. Hence, it is not necessary that the oscillation in the ring oscillator is immediately stopped after receiving the stop signal 410, as the outputs of the comparators 407a to 407n are latched in response to the reception of the stop signal 410 and are therefore held constant independent from their input signals.

Hence, the ring oscillator 400 may be used for measuring time differences and may therefore also be designated as a time to digital converter 400, which for example measures a time between the insertion of the start edge by the start edge injector 203 and the occurrence of the stop signal 410.

Furthermore, the ring oscillator 400 comprises a top hot one decoder 411a and a bottom hot one decoder 411b, a top thermo to binary decoder 413a and a bottom thermo to binary decoder 413b. Furthermore, the ring oscillator 400 comprises a top multiplex counter 415a and a bottom multiplex counter 415b. Furthermore, the ring oscillator 400 comprises a multiplexed bottom counter 417b and a multiplexed top counter 417a. Furthermore, the ring oscillator 400 comprises a first general multiplexer 419 and a second general multiplexer 421. Furthermore, the ring oscillator 400 comprises a modulo 32 integrator 423.

In the following, functionalities of the different units will be explained in more detail.

The differential implementation of the time to digital converter 400 may be used, for example, for an all digital wireless PLL. As an example, the time to digital converter may measure the time between the rising edge of the 26 MHz reference clock and the rising edge of a multi modulus divider (MMD) edge. The start edge injector 203 injects the start edge via the start edge multiplexers 303 into the differential ring oscillator 400, as already pointed out. In the example shown in FIG. 4, the ring oscillator 400 comprises 32 different delay stages 401a to 401n with a unit delay of, for example, 8 picoseconds. After starting the ring oscillator, the ring oscillator edge circles around. The polarity of the ring oscillator edge in the ring oscillator 400 changes after every circulation. In the example of measuring the time between the rising edge of the 26 MHz reference clock and the rising edge of the multi modulus divider edge, the stop edge or stop signal 410 is derived from the rising MDD edge. This stop signal 410 triggers the comparators 407a to 407n to latch the current states of the 32 differential receive oscillator voltages. The following example illustrates the latched 32 comparator output for an even circulation and an odd circulation and the corresponding outputs of the hot one decoders 411a, 411b. The hot one decoders 411a, 411b are configured to convert the even and odd dependent comparator output thermometer code in a circulation independent hot one code:

| Comparator out even: | 00000000000000001111111111111111 |
| Hot One Decoder out: | 00000000000000001000000000000000 |
| Comparator out odd:  | 11111111111111110000000000000000 |
| Hot One Decoder out: | 00000000000000100000000000000000 |

Figure 7A:
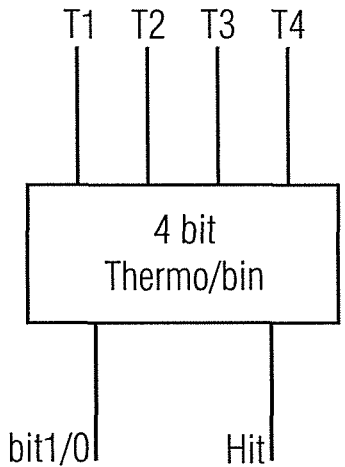
FIG. 7a shows an exemplary implementation of a 4-bit thermo to binary converter used in the ring oscillator from FIG. 4.

Furthermore, the two thermo to binary decoders 413a, 413b are configured to convert the top and bottom 16 hot one decoder outputs of the hot one decoders 411a, 411b to a 4-bit binary code. Each of the thermo to binary decoders 413a, 413b may comprises a plurality (e.g. four) of 4-bit thermo to binary decoders. FIG. 7a shows an example for such a 4-bit thermo to binary decoder, the 4-bit thermo to binary decoder has on the one hand the data outputs B1, B2 which indicate at which position (at which input T1, T2, T3, T4) the oscillator edge occurred and on the other hand an additional signal hit which indicates whether the hot one was decoded at this 4-bit thermo to binary decoder or not.

Since in the mismatch shaping TDC 400 each delay stage 401a to 401n could be a start edge injection point, missing codes are still a problem. To overcome this problem additional counter taps are introduced, which are independently multiplexed on the (5-bit) value of the modulo 32 integrator 423. The modulo 32 integrator 423 sums up the 5-bit bin results 425 of all previous conversions and has a range of 0 to 31. Hence, the modulo 32 integrator 423 may be used to determine into which of the plurality of delay stages 401a to 401n the next start edge is to be inserted. In other words, the start edge injector 203 is configured to choose the delay stage 401a to 401n for inserting the start edge for a next oscillation cycle in dependence on the value of the modulo 32 integrator 423 and therefore in dependence on the sum of all previous conversions. In other words, in the mismatch shaping TDC 400 the 32 pairs of start edge multiplexers 303 are introduced, where each of them is connected to the start line or the start edge injector 203. One of these 32 pairs of start edge multiplexers 303 is activated to inject the start edge into the ring oscillator 400. The start edge injector 203 (or a multiplexer selection decoder of the start edge injector 203) activates one pair of multiplexers dependent on the value of the modulo 32 integrator 423.

Figure 7B:
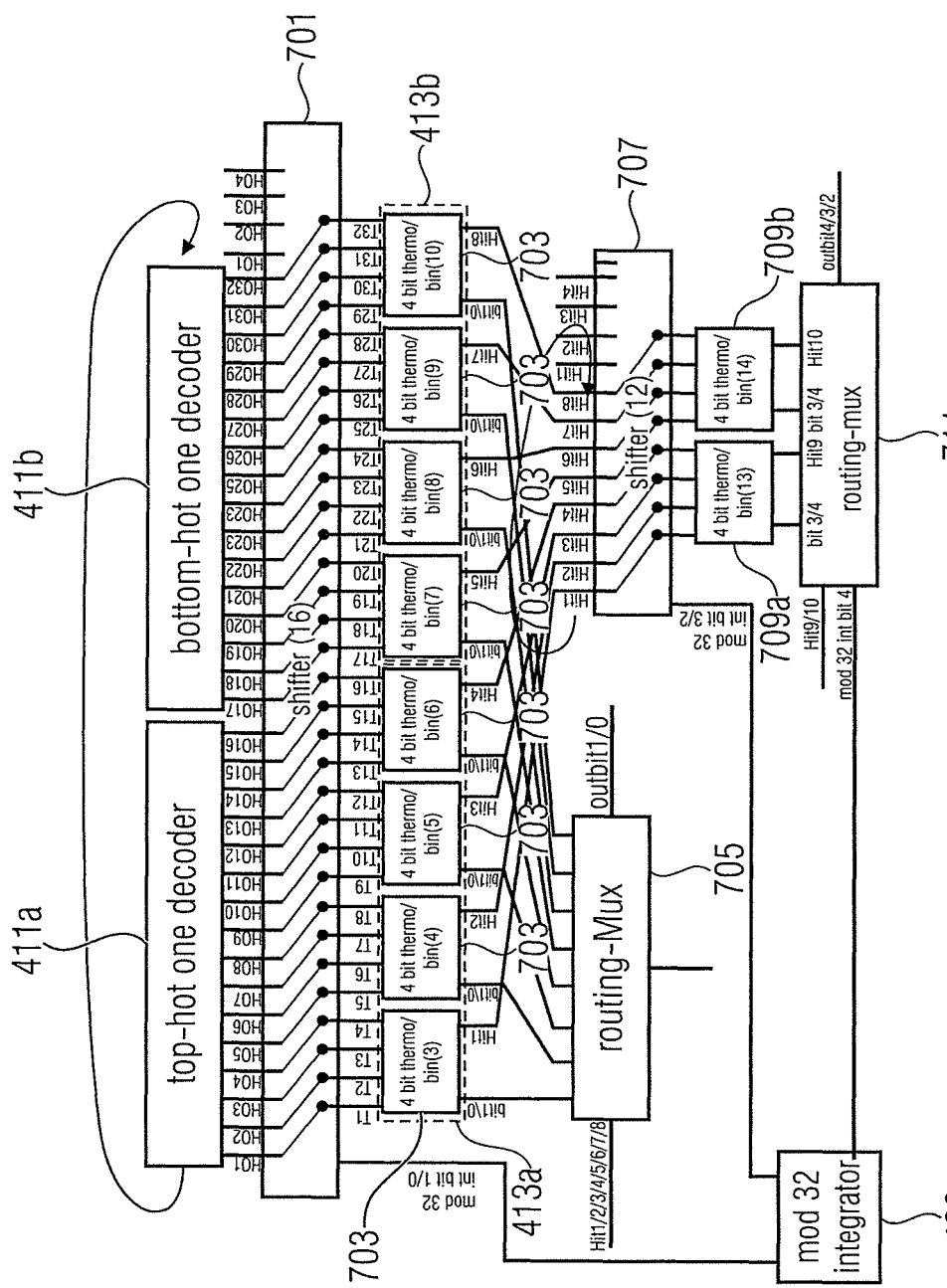
FIG. 7b shows an exemplary implementation for a decoder of the ring oscillator shown in FIG. 4, which is rotated in accordance with the start edge injection point.

FIG. 7b shows the connection between the hot one decoders 411a, 411b and the thermo to binary decoders 413a, 413b. Due to the variation of the injection point for the start edge in the ring an additional shifter 701 is provided which is coupled between the hot one decoders 411a, 411b and the thermo to binary decoders 413a, 413b.

Furthermore, each of the thermo to binary decoders 413a, 413b comprises four 4-bit thermo to binary decoders 703 as shown in FIG. 7a. In other words, the 16 bits of a thermo to binary decoder 413a, 413b are separated in 4-bit thermo to binary decoder segments 703. Each 4-bit thermo to binary decoder 703 is decoding two bits. The hit signals Hit1 to Hit4 and Hit5 to Hit8 indicate in which of the eight 4-bit thermo to binary decoders 403 a zero to one transition occurred in its input bits.

The additional shifter 701 is configured to rotate the outputs HO1 to HO32 of the hot one decoders 411a, 411b in dependence on the output of the modulo 32 integrator 423. In detail, the modulo 32 integrator bits 1/0 indicate the rotation of the assignment of the hot one decoder outputs HO1 to HO32 to the thermo to binary decoder inputs T1 to 32. For a value of the modulo 32 integrator bits 1/0=0 no rotation appears. For bit values of the modulo 32 integrator bits 1/0=1/2/3 the assignment is rotated by 1/2/3. A first routing multiplexer 705 is configured to receive the bit output signals of the 4-bit thermo to binary decoders 703 and to provide at an output of the routing multiplexer 705 one of these bit signals in dependence on the hit signals received from the 4-bit thermo to binary decoders 703. In other words, the first routing multiplexer 705 routes the bits 1/0 of the 4-bit thermo to binary decoders 703 with the highest hit signal equal to 1 to the output bit 1/0.

A further shifter 707 receives the hit signals Hit1 to Hit8 of the 4-bit thermo to binary decoder 703 at its inputs and has a similar functionality as the shifter 701 in that it rotates the assignment of the hit signals Hit1 to Hit8 to two further 4-bit thermo to binary decoders 709a, 709b in dependence on the bits 3/2 of the value of the modulo 32 integrator 423. A second routing multiplexer 711 is configured to route dependent on the hit signals 9/10 of the 4-bit thermo to binary decoders 709a, 709b either the output bits 3/4 of the first 4-bit thermo to binary decoder 709a of the further 4-bit thermo to binary decoders 709a, 709b or of the second 4-bit thermo to binary decoder 709b of the further thermo to binary decoders 709a, 709b to the output bits 3/2. Furthermore, the hit signals Hit9 and Hit10 provided by the further thermo to binary decoder 709a, 709b are multiplexed to output bit 4 dependent on bit 4 of the value of the modulo 32 integrator 423.

As all digital cellular PLLs use a 26 MHz/38 MHz reference clock, the additional shaping logic as shown in FIG. 7b is not power consuming and a logic setup time is not an issue.

The output bits 4/3/2/1/0 provided by the two routing multiplexers 705, 711 form a state output 425 of the ring oscillator 400. The is state output 425 indicates at which delay stage the ring oscillator edge occurred at the moment at which the stop signal 410 was received and the state of the ring oscillator 400 was latched. Hence, the output bits (the state output 425) provided by the routing multiplexers 705, 711 comprise at least a part of the result of the current measurement or oscillation cycle (as the number of complete circulations around the ring oscillator is counted by the top multiplex counter 415a and the bottom multiplex counter 415b and is provided as a counter value 427). Hence, the state output 425 provided by the router multiplexers 705, 711 indicate at which delay stage the oscillator edge occurred when the state of the ring oscillator 400 has been latched but do not indicate the number of circulations that the ring oscillator edge has performed around the complete ring during the last oscillation cycle.

As an example, the routing multiplexer 705, the further shifter 707, the further 4-bit thermo to binary decoder 709a, 709b and the second routing multiplexer 711 may be integrated in the first general multiplexer 421 shown in FIG. 4. The state output 425 provided by the routing multiplexers 705, 711 (and therefore by the general multiplexer 421) are provided to the modulo 32 integrator 423 which accumulates the state outputs 425 (using a modulo 32 addition) for subsequent oscillation cycles.

To summarize, the output signal of the second general multiplexer 421 (the state output 425) comprises the output bits 4/3/2/1/0 provided by the routing multiplexers 705, 711. This state output 425 together with the counter output value 427 provided by the second general multiplexer 419 forms the result (e.g. the measured difference between the start edge and the stop edge) of a current measurement or oscillation cycle.

The top multiplex counter 415a and the bottom multiplex counter 415b independently count the circulations in the ring oscillator 400. The two counters are used to avoid missing codes due to mismatch between the counter and the thermo to binary decoder result (the state output 425). This case may occur if ring oscillator states are latched and a comparator with a counter tap does not detect due to a meta-stability on the edge, which is counted by the counter. From FIG. 4 it may be seen that each of the multiplex counters 415a, 415b is connected to at least outputs of two different comparators of the plurality of comparators 407a to 407n to independently count circulations of the ring oscillator at different positions or counter taps. The results of the counter values determined from the different counter taps are multiplexed dependent on the value of the modulo 32 integrator 423 to avoid missing codes. Hence, the counter value 427 provided at the output of the second general multiplexer 419 is equal to a counter value acquired from one of a plurality of counter taps of the ring oscillator 400. To summarize, the ring oscillator 400 comprises a circulation counter for counting the circulation in the ring oscillator 400 which is configured to vary a counter tap in the ring at which the circulation counter counts the circulations.

Furthermore, the circulation counter is configured to choose the counter tap for counting circulations in a given oscillation cycle in dependence on the start edge injection point for the given oscillation cycle (which is indicated by the value of the modulo 32 integrator 423).

Furthermore, the circulation counter may comprise a plurality of single counters, each single counter is configured to count the circulation in the ring at an associated counter tap, wherein counter taps associated to different single counters of the plurality of single counters differ in the position in the ring. For example, the top multiplex counter 415a may comprise four single counters, wherein a first one of the single counters counts the number of circulations in the ring at the output of the first comparator 407a, a second single counter counts the number of circulations in the ring at a fifth comparator, a third single counter counts the number of circulations at a ninth comparator and a fourth single counter counts the number of circulations in the ring at a thirteenth comparator. The circulation counter is configured to choose for a given oscillation cycle one single counter of the plurality of single counters in dependence on the start edge injection point for the given oscillation cycle for counting the number of circulations in the given oscillation cycle. This choosing of the single counter, which delivers the counter value 427 at the output of the second general multiplexer 419 is performed using the multiplexed top counter 417a, the multiplexed bottom counter 417b and the general multiplexer 419 in dependence on—the value of the modulo 32 integrator 423 (which indicates the start edge injection input for the current oscillation cycle).

Furthermore, the ring oscillator 400 comprises a state detector configured to, upon reception of the stop signal 410, detect a state of the ring oscillator based on states of the plurality of delay elements (based on the latched states of the comparators 407a to 407n). Such a state detector may comprise, for example, the hot one decoders 411a, 411b, the thermo to binary decoders 413a, 413b, the shifter 701, and furthermore the multiplexer 421 and the modulo 32 integrator 423.

The state detector is configured to derive, based on the states of the plurality of delay stages, a state code indicating at which of the plurality of delay stages the ring oscillator edge occurred at the moment of reception of the stop signal. Such a state code may be, for example, the output signals at the output of the latched comparators 407a to 407n which were latched in response to the reception of the stop signal 410.

As described in the example above, a value of such a state code, which indicates that the ring oscillator occurred at a given delay element of the plurality of delay elements at the moment of reception of the stop signal 410, is different for an odd number of circulations and an even number of circulations. Hence, the state detector comprises the thermo to binary decoders 413a, 413b which are configured to convert this state code to an even and odd independent code, values of which are independent based on an even or odd number of circulations.

Furthermore, as described in conjunction with FIG. 7b the hot one decoders 411a, 411b are configured to derive the state code in a hot one representation (being formed by the output signals HO1 to HO32 of the hot one decoders 411a, 411b) based on the states of the plurality of delay elements 403a to 403n, 405a to 405n of the plurality of delay stages 401a to 401n at the moment of reception of the stop signal 410. Furthermore, the state detector comprises the thermo to binary decoders 413a to 413b which are configured to convert the state code from the hot one representation to a binary representation (e.g., in the form of the output bits of the 4-bit thermo to binary decoders 703). This conversion happens based on an assignment of the bits of the state code in the hot one representation to bits of the state code in the binary representation. This assignment is performed by the shifter 701, which connects the outputs HO1 to HO32 of the hot one decoders 411a, 411b to the inputs T1 to T32 of the 4-bit thermo to binary decoders 703. As already pointed out this assignment is dependent on the value of the modulo 32 integrator 423 and therefore dependent on the injection point for the start edge for the last oscillation cycle (a result of which is currently sampled with the state detector).

Although in the example shown in FIG. 4 the differentiation between top and bottom hot one decoder and thermo to binary decoder is performed, in a further exemplary implementations of the ring oscillator 400, one general hot one decoder and one general thermo to binary decoder may be sufficient.

Furthermore, in the example shown in FIG. 4, 32 delay stages 401a to 401n are shown. However, it will be appreciated that a number of delay stages may be freely chosen (e.g., in dependence on a desired application of the ring oscillator 400 or the time to digital converter 400).

Figure 8:
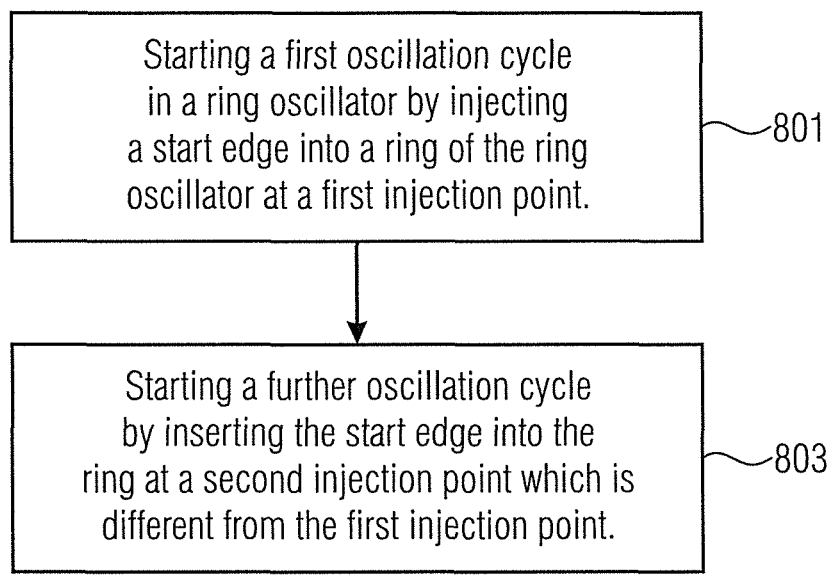
FIG. 8 shows a flow diagram of an exemplary method.
Figure 9:
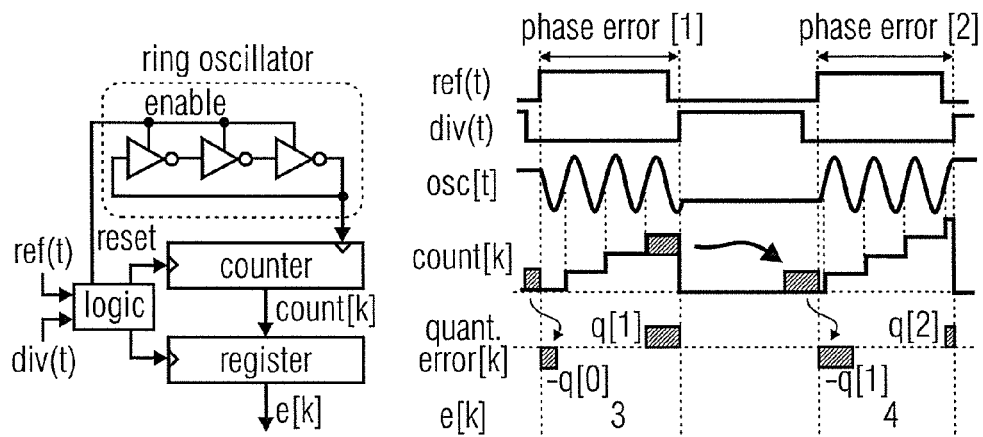
FIG. 9 shows an illustration of a working principle of a gated ring oscillator and a mismatch shaping performed in the disclosed gated ring oscillator.
Figure 9:
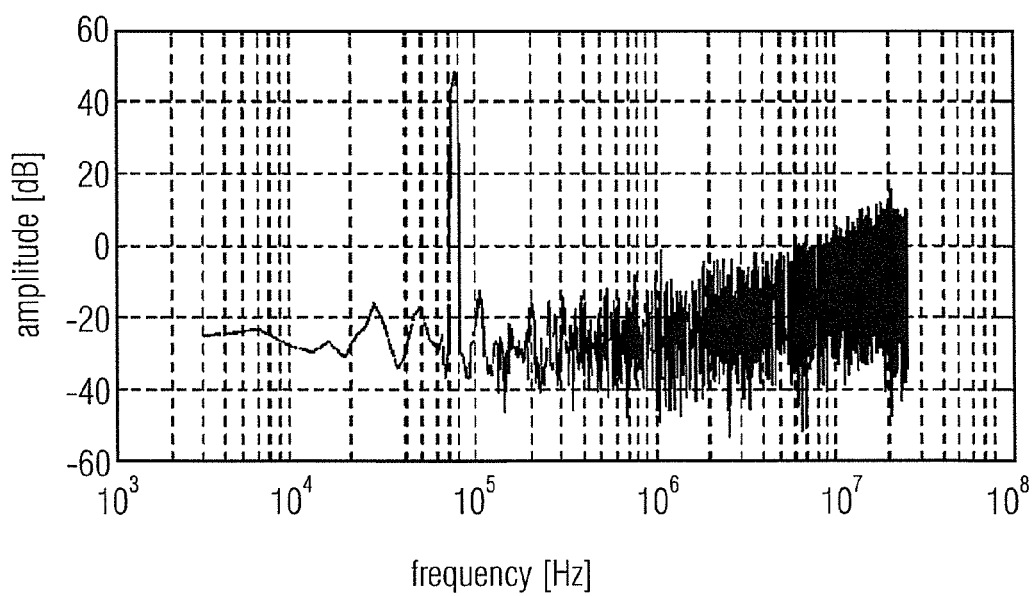

FIG. 8 shows a flow diagram of an exemplary method 800.

At 801a first oscillation cycle in a ring oscillator is started by injecting a start edge into a ring of the ring oscillator at a first injection point.

At 803 a further oscillation cycle is started by inserting the start edge into the ring at a second injection point which is different from the first injection point.

The method 800 may be performed by exemplary ring oscillators, such as the ring oscillator 200 or the ring oscillator 400 or any other exemplary ring oscillator.

In an exemplary ring oscillator, a barrel shifting or a random injection point variation is applied to improve the integral nonlinearity. Furthermore, exemplary ring oscillators may be used in time to digital converters.

An exemplary ring oscillator comprises a ring of N delay elements.

In such an exemplary ring oscillator delay elements with and without a start edge multiplexer may exist.

Furthermore, two, some or all delay elements of such a ring may comprise such a start edge multiplexer.

Furthermore, a delay stage may comprise a pair of multiplexers which is configured to inject edges having different phases in the ring oscillator to start an oscillation of the ring oscillation.

Some/all or at least two of such multiplexers may be connected to a single line or a bus for injecting the start edge (e.g. being a differential start edge).

The start edge multiplexers may be activated at the injection point for inserting the start edge at this injection point by one or more selection logic (e.g. start edge injector 203).

This start edge injector 203 may activate one of the start edge multiplexers or a pair of such start edge multiplexers in dependence on a last conversion result or an independent value (such as a randomly generated value).

The oscillation in the ring oscillator may be stopped via such multiplexers or another mechanism inside a delay element.

Furthermore, at the end of a conversion, a comparator (such as the comparators 407a to 407n), detector or a self-comparing delay element snaps or latches a state of the ring oscillator.

Furthermore, the ring oscillator 400 comprises a unit (the thermo to binary decoder 413a, 413b in conjunction with the second general multiplexer 421) which is configured to convert the even and odd circulation dependent comparator/detector code in an even and odd independent code.

Furthermore, the ring oscillator 400 comprises a decoder for converting the even/odd independent code, e.g. in a binary or other codes with a reduced width when compared to the input codeword (such as the multiplexer 421, which provides the output signal 425 having a reduced bit width when compared to the 32 bits of the state code as generated by the hot one decoder 411a, 411b).

Furthermore, the ring oscillator 400 comprises a decoder which is configured to perform a ring oscillator injection point compensation (by rotating the assignment between the hot one decoder 411a, 411b and the thermo to binary decoders 413a, 413b in dependence on the start edge injection point.

Furthermore, the ring oscillator 400 comprises a plurality of units which (simultaneously) count the circulations in the ring oscillator 400 (e.g. the top multiplexer counter 415a and the bottom multiplexer counter 415b). Furthermore, inside these multiplexer counters 415a, 415b even further single counters may be provided each of which has an associated counter tap connected to an output of one of the comparators 407a to 407n at which it counts the circulations in the ring oscillator 400.

The counter tap which is used for deriving the counter value 427 is selected in dependence on the start edge injection point for the last oscillation cycle.

If, as shown in FIG. 4, the counter taps are not moved, one of several redundant counters (one of the single counters provided in the multiplex counters 415a, 415b) is selected in dependence on the start edge injection point.

Furthermore, the ring oscillator 400 comprises a logic to calculate the result of a current oscillator cycle from the ring oscillator state (as indicated by the state output 425 and the counter value 427).

The method 800 may be supplemented by any of the features and functionalities described herein with respect to the apparatus, and may be implemented using the hardware components of the apparatus.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some examples, some one or more of the most important method steps may be executed by such an apparatus.

Depending on certain implementation requirements, examples may be implemented in hardware or in software. The implementation may be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some examples comprise a data carrier having electronically readable control signals, which are capable of cooperating with a programmable computer system, such that one of the methods described herein is performed.

Generally, examples may be implemented as a computer program product with a program code, the program code being operative for performing one of the methods when the computer program product runs on a computer. The program code may for example be stored on a machine readable carrier.

Other examples comprise the computer program for performing one of the methods described herein, stored on a machine readable carrier.

In other words, an implementation of the exemplary method is, therefore, a computer program having a program code for performing one of the methods described herein, when the computer program runs on a computer.

A further implementation of the exemplary method is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further implementation of the exemplary method is, therefore, a data stream or a sequence of signals representing the computer program for performing one of the methods described herein. The data stream or the sequence of signals may for example be configured to be transferred via a data communication connection, for example via the Internet.

A further example comprises a processing means, for example a computer, or a programmable logic device, configured to or adapted to perform one of the methods described herein.

A further example comprises a computer having installed thereon the computer program for performing one of the methods described herein.

A further example comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some examples, a programmable logic device (for example a field programmable gate array) may be used to perform some or all of the functionalities of the methods described herein. In some examples, a field programmable gate array may cooperate with a microprocessor in order to perform one of the methods described herein. Generally, the methods are preferably performed by any hardware apparatus.

The above described examples are merely illustrative. It is understood that modifications and variations of the arrangements and the details described herein will be apparent to others skilled in the art. It is the intent, therefore, to be limited only by the scope of the impending patent claims and not by the specific details presented by way of description and explanation of the examples herein.

Although each claim only refers back to one single claim, the disclosure also covers any conceivable combination of claims.

The invention claimed is:

1. A ring oscillator, comprising:
   a ring comprising a plurality of delay elements; and
   a start edge injector configured to inject a start edge into the ring and vary an injection point for the start edge in the ring by varying a selection of a delay element from among the plurality of delay elements into which the start edge injector injects the start edge.

2. The ring oscillator according to claim 1, wherein the start edge injector is configured to inject the start edge in the ring by releasing an output of the delay element of the plurality of delay elements which was forced to a predetermined potential.

3. The ring oscillator according to claim 2, wherein the start edge injector is configured to vary the injection point for the start edge by varying the delay element of the plurality of delay elements, an output of which is forced to the predetermined potential and is released for inserting the start edge by the start edge injector.

4. The ring oscillator according to claim 1, wherein at least two delay elements in the ring comprise a start edge injection input for forcing an output of the delay element to a predetermined potential independent of a potential at an input of the delay element.

5. The ring oscillator according to claim 4, wherein the start edge injector is configured to, for starting a first oscillation cycle, insert the start edge into the start edge injection input of a first delay element of the two delay elements comprising a start edge injection input; and
   wherein subsequently after finishing the first oscillation cycle, the start edge injector is configured to, for starting a second oscillation cycle, insert the start edge into the start edge injection input of a second delay element of the two delay elements comprising a start edge injection input.

6. The ring oscillator according to claim 1, wherein the start edge injector is configured to choose the injection point for inserting the start edge for a next oscillation cycle in dependence on the result of a last oscillation cycle.

7. The ring oscillator according to claim 1, wherein upon injection of the start edge into the ring, the inserted start edge is propagated as a ring oscillator edge from one delay element to a next delay element in the ring until the oscillation cycle is stopped.

8. The ring oscillator according to claim 7,
wherein the ring oscillator is configured to, upon reception of a stop signal, latch a state of the ring oscillator; and
wherein the start edge injector is configured to insert the start edge for a next oscillation cycle into a last delay element in the ring to which the ring oscillator edge was propagated before the stop signal was received.

9. The ring oscillator according to claim 1, wherein the start edge injector is configured to randomly determine the injection point for the start edge for a next oscillation cycle.

10. The ring oscillator according to claim 1, wherein the start edge injector is configured to, before an oscillation cycle is to be started, choose the injection point for inserting the start edge for the oscillation cycle by forcing an output of a chosen delay element to a predetermined potential.

11. The ring oscillator according to claim 10, wherein the start edge injector is configured to force the output of the chosen delay element to the predetermined potential at least until an input of the chosen delay element has the predetermined potential before the start edge injector releases the output of the chosen delay element for inserting the start edge into the ring.

12. The ring oscillator according to claim 11, wherein the start edge injector is configured to, during forcing the output of the chosen delay element to the predetermined potential keeping the outputs of other delay elements preceding or succeeding the chosen delay element in the ring in a released state.

13. The ring oscillator according to claim 1,
wherein the ring is a single ended ring;
wherein the ring oscillator comprises at least a first start edge multiplexer, for providing a first injection point at a first delay element of the plurality of delay elements, which is configured to insert the start edge into the ring at the first delay element and a second start edge multiplexer, for providing a second injection point at a second delay element of the plurality of delay elements, which is configured to insert the start edge into the ring at the second delay element; and
wherein the start edge injector is configured to activate for inserting the start edge into the ring, at maximum, one of the first start edge multiplexer and the second start edge multiplexer.

14. The ring oscillator according to claim 1, wherein the start edge injector comprises per delay element of the plurality of delay elements an associated start edge multiplexer for inserting the start edge into the ring at the associated delay element.

15. The ring oscillator according to claim 1, wherein the ring is a differential ring comprising a plurality of delay stages, wherein each delay stage comprises a first delay element and a second delay element of the plurality of delay elements, the first delay elements being connected in series to form a first delay chain of the differential ring and the second delay elements being connected in series to form a second delay chain of the differential ring.

16. The ring oscillator according to claim 15,
wherein the ring oscillator comprises at least a first pair of start edge multiplexers for providing a first injection point at a first delay element and a second delay element of a first delay stage of the plurality of delay stages for inserting the start edge into the ring at the first delay stage and a second pair of start edge multiplexers for providing a second injection point at a first delay element and a second delay element of a second delay stage of the plurality of delay stages for inserting the start edge into the ring at the second delay stage; and
wherein the start edge injector is configured to activate for inserting the start edge into the ring, at maximum, one of the first pair of start edge multiplexers and the second pair of start edge multiplexers.

17. The ring oscillator according to claim 15, wherein the start edge injector is configured to insert the start edge as a differential edge into the ring.

18. The ring oscillator according to claim 17, wherein the start edge injector is configured to insert the start edge into the ring by releasing an output of the first delay element of a delay stage of the plurality of delay stages which was forced to a first predetermined potential and an output of the second delay element of the delay stage which was forced to a second predetermined potential, the first predetermined potential and the second predetermined potential being different from each other.

19. The ring oscillator according to claim 18, wherein the first predetermined potential corresponds to a first logical state and the second predetermined potential corresponds to a second logical state, which is complementary to the first logical state.

20. The ring oscillator according to claim 15, wherein at least for a pair of two subsequent delay stages in the ring, an output of the first delay element of a first delay stage of the pair is coupled to an input of a second delay element of a second delay stage of the pair and an output of the second delay element of the first delay stage is coupled to an input of the first delay element of the second delay stage.

21. The ring oscillator according to claim 1, further comprising a circulation counter configured to count a number of circulations in the ring oscillator.

22. The ring oscillator according to claim 21, wherein the circulation counter is configured to vary a counter tap in the ring at which the circulation counter counts the circulations.

23. The ring oscillator according to claim 22, wherein the circulation counter is configured to choose the counter tap for counting the circulations in a given oscillation cycle in dependence on a start edge injection point for the given oscillation cycle.

24. The ring oscillator according to claim 21, wherein the circulation counter comprises a plurality of single counters, each single counter being configured to count the circulations in the ring at an associated counter tap, wherein counters taps associated with different single counters of the plurality of single counters have different positions within the ring.

25. The ring oscillator according to claim 24, wherein the circulation counter is configured to choose, for a given oscillation cycle, one single counter of the plurality of single counters depending on a start edge injection point for the given oscillation cycle for counting the number of circulations in the given oscillation cycle.

26. The ring oscillator according to claim 1, further comprising a state detector configured to, upon reception of a stop signal, sample a state of the ring oscillator based on states of the plurality of delay elements.

27. The ring oscillator according to claim 26,
wherein after insertion of the start edge into the ring, the start edge is propagated as a ring oscillator edge from one delay element to a next delay element in the ring; and
wherein the state detector is configured to derive, based on states of a plurality of delay stages, a state code indicating at which of the plurality delay stages the ring oscillator edge occurred at a moment of the reception of the stop signal.

28. The ring oscillator according to claim 27,
wherein a value of the state code indicating that the ring oscillator edge occurred at a given delay element of the plurality of the delay elements at the moment of the reception of the stop signal is different for an odd number of circulations than for an even number of circulations; and
wherein the state detector is configured to convert the state code to an even-and-odd-independent code, values of which are independent on an even or odd number of circulations.

29. The ring oscillator according to claim 27,
wherein the state detector comprises a hot one decoder configured to derive the state code in a hot-one-representation based on the states of the plurality of delay elements at the moment of the reception of the stop signal;
wherein the state detector comprises a thermo-to-binary-decoder configured to convert the state code from the hot-one-representation to a binary representation based on an assignment of bits of the state code in the hot-one-representation to bits of the state code in the binary representation; and
wherein the assignment is dependent on the injection point of the start edge for a last oscillation cycle.

30. A method, comprising:
starting a first oscillation cycle in a ring oscillator by injecting a start edge into a ring comprising a plurality of delay elements of the ring oscillator at a first injection point; and
starting a further oscillation cycle by inserting the start edge into the ring at a second injection point which is different from the first injection point by varying a selection of a delay element from among the plurality of delay elements of the ring into which the start edge is injected.

31. The method according to claim 30, wherein the second injection point is chosen in dependence on a result of the first oscillation cycle.

32. A computer readable digital storage medium having stored thereon a computer program having a program code for performing, when running on a computer, a method, comprising:
starting a first oscillation cycle in a ring oscillator by injecting a start edge into a ring comprising a plurality of delay elements of the ring oscillator at a first injection point; and
starting a further oscillation cycle by inserting the start edge into the ring at a second injection point which is different from the first injection point by varying a selection of a delay element from among the plurality of delay elements of the ring into which the start edge injector injects the start edge.

33. A mobile communication device comprising:
an antenna port;
an RF frontend; and
a digital baseband processor;
wherein the RF frontend or the digital baseband processor comprises a ring oscillator having a ring of a plurality of delay elements and a start edge injector configured to inject a start edge into the ring and vary an injection point for the start edge in the ring by varying a selection of a delay element from among the plurality of delay elements into which the start edge injector injects the start edge; and
wherein the RF frontend is coupled to the digital baseband processor and the antenna port.

34. The mobile communication device according to claim 33,
wherein the ring oscillator is part of a time to digital converter of the RF frontend or the digital baseband processor.

35. A ring oscillator, comprising:
a differential ring comprising a plurality of delay stages, wherein respective delay stages comprise a first delay element and a second delay element, the first delay elements being connected in series to form a first delay chain of the differential ring and the second delay elements being connected in series to form a second delay chain of the differential ring;
a start edge injector for injecting a start edge into the ring by forcing the output of the first delay element of a chosen delay stage of the plurality of delay stages to a first predetermined potential corresponding to a first logical state and the output of the second delay element of the chosen delay stage to a second predetermined potential corresponding to a second logical state, which is complementary to the first logical state, at least until an input of the first delay element of the chosen delay stage has the first predetermined potential and an input of the second delay element of the chosen delay stage has the second predetermined potential and by subsequently releasing the outputs of the first delay element and the second delay element of the chosen delay stage; and
a circulation counter configured to count the circulations in the ring oscillator;
wherein an output of the last series-connected delay element of the first delay chain is connected to an input of the first series-connected delay element of the second delay chain and an output of the last series-connected delay element of the second delay chain is connected to an input of the first series-connected delay element of the first delay chain;
wherein the start edge injector is configured to vary an injection point for the start edge in the ring by varying the chosen delay stage;
wherein upon injection of the start edge into the ring, the inserted start edge is propagated as a ring oscillator edge from one delay stage to the next delay stage in the ring until the oscillation cycle is stopped;
wherein the ring oscillator is configured to, upon reception of a stop signal, latch a state of the ring oscillator;
wherein the start edge injector is configured to choose the last delay stage to which the ring oscillator edge was propagated before the stop signal was received as the chosen delay stage into which the start edge for a next oscillation cycle is inserted;
wherein the circulation counter comprises a plurality of single counters, each single counter being configured to count the circulations in the ring at an associated counter tap, wherein counters taps associated to different single counters of the plurality of single counters differ in their position in the differential ring;

wherein the circulation counter is configured to choose for a given oscillation cycle one single counter of the plurality of single counters in dependence on the start edge injection point for the given oscillation cycle for counting the number of circulations in the given oscillation cycle.

* * * * *